(12) United States Patent
Lee et al.

(10) Patent No.: US 8,551,795 B2
(45) Date of Patent: Oct. 8, 2013

(54) MASK

(75) Inventors: Jae Hyuk Lee, Paju-si (KR); Young Hoon Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 99 days.

(21) Appl. No.: 13/153,482

(22) Filed: Jun. 6, 2011

(65) Prior Publication Data

US 2012/0164771 A1    Jun. 28, 2012

(30) Foreign Application Priority Data

Dec. 28, 2010   (KR) .................. 10-2010-0136464

(51) Int. Cl.
*H01L 21/00* (2006.01)
(52) U.S. Cl.
USPC ....... 438/34; 257/797; 257/E21.036; 118/721
(58) Field of Classification Search
USPC ............. 438/34; 257/798, E21.034, E21.036; 445/47; 156/345.3; 118/721
See application file for complete search history.

(56) References Cited

U.S. PATENT DOCUMENTS

| 2003/0044516 | A1* | 3/2003 | Nishikawa et al. | 427/66 |
| 2006/0154407 | A1* | 7/2006 | Han et al. | 438/149 |
| 2007/0190889 | A1* | 8/2007 | Lee et al. | 445/47 |
| 2010/0080915 | A1* | 4/2010 | Masuda et al. | 427/282 |
| 2010/0224125 | A1* | 9/2010 | Lee et al. | 118/504 |
| 2011/0230010 | A1* | 9/2011 | Guo et al. | 438/98 |

FOREIGN PATENT DOCUMENTS

KR    10-20100028302 A    3/2010

* cited by examiner

*Primary Examiner* — Caridad Everhart
(74) *Attorney, Agent, or Firm* — McKenna, Long and Aldridge, LLP.

(57) ABSTRACT

Disclosed is a mask which can be used for forming a pattern on a substrate in a deposition apparatus, and a method for manufacturing a display device using the same. The mask includes a mask pattern and a frame. The mask has a tapered shape where the inner surface of the frame tapers in a direction from an upper end to a lower end. A thin film pattern is formed on a substrate using the mask pattern of the mask. The frame supports an outer of the mask pattern, and includes an inclined plane which tapers in an inner direction where the mask pattern is disposed.

18 Claims, 5 Drawing Sheets

MASK

This application claims the benefit of the Korean Patent Application No. 10-2010-0136464, filed on Dec. 28, 2010, which is hereby incorporated by reference as if fully set forth herein.

BACKGROUND OF THE INVENTION

1. Field of the Invention

The present invention relates to a mask for forming a pattern on a substrate in a deposition apparatus and a method for manufacturing a display device using the same, and more particularly, to a mask which is applied to Plasma Enhancement Chemical Vapor Deposition (PECVD) for forming a passivation layer of an Organic Light Emitting Diode (OLED) display.

2. Discussion of the Related Art

Generally, vapor deposition is largely categorized into Physical Vapor Deposition (PVD) and Chemical Vapor Deposition (CVD).

A difference between the PVD and the CVD exists according to a process that is performed when a deposited material is changed from a gaseous state to a solid state. Particularly, there is a clear difference in that the PVD requires a vacuum environment, but the CVD is sufficiently performed even at an environment of tens to hundreds torr or a normal pressure environment. In this case, the CVD requires an environment of a far higher temperature than that of the PVD.

As examples of the PVD, there are sputtering, E-beam evaporation, thermal evaporation, Laser Molecular Beam Epitaxy (L-MBE), and Pulsed Laser Deposition (PLD). The reason that such processes may be included in the PVD is because when a material to be deposited is deposited on a substrate, an operation of changing a gaseous state to a solid state accompanies physical change.

As examples of the CVD, there are Metal-Organic Chemical Vapor Deposition (MOCVD) and Hydride Vapor Phase Epitaxy (HVPE). The CVD conveys raw materials in a gaseous state, but the raw materials have a chemical reaction on the surface of a substrate.

The CVD process is largely categorized into three processes according to the reaction condition of a reaction chamber (for example, according to the degree of vacuum).

First, Atmospheric Pressure Chemical Vapor Deposition (APCVD) induces a reaction with energy due to heat when the degree of vacuum of a reactor is an atmospheric pressure.

Second, Low Pressure Chemical Vapor Deposition (LPCVD) induces a reaction with energy due to heat when the degree of vacuum of a reactor is a low pressure.

Third, PECVD induces a reaction with energy due to heat and plasma generated by a Radio Frequency (RF) power when the degree of vacuum of a reactor is a low pressure.

FIGS. 1 and 2 are exemplary views illustrating a state where a substrate and a mask are aligned in a PECVD apparatus.

The PECVD provides one or more compound gases, which includes an element configuring a thin film material to be formed, onto a substrate and thus forms a desired thin film by a chemical reaction that is performed in a gaseous state or a substrate surface.

Such a PECVD apparatus includes a vacuum chamber (not shown) where a chemical reaction is performed and a stage that is horizontally disposed in the vacuum chamber for supporting a substrate 10.

The PECVD apparatus is generally used without a separate mask when a thin film is formed on a substrate, but may use a mask 20 of FIG. 1, for example, when a passivation layer of an Organic Light Emitting Diode (OLED) display is formed.

In the PECVD apparatus, as illustrated in FIG. 1A, the mask 20, which is used when forming the passivation layer of the OLED display, includes a mask pattern 22 formed inside a frame 21. The substrate 10 is disposed under the mask 20 and on a stage in a shape where the substrate 10 is formed in a direction from an upper portion to a lower portion.

The material of the frame 21 may be ceramic or metal. When the material of the frame 21 is metal, sagging of the mask may be minimized through stretch.

However, as illustrated in FIG. 1B, because the mask 20 is formed in a right angular shape at the edge of the frame 21 without any step, a shadow effect (illustrated with dot lines in FIG. 1B) may occur on the substrate or near the mask pattern region depending on the thickness of raw materials. The shape of the shadow may vary.

That is, as illustrated in FIG. 1B, when the lower portion of the mask 20 is stretched, such a shadow effect may seriously occur due to the thickness of the frame 21.

As illustrated in FIGS. 2A and 2B, when the upper portion of the mask 20 is stretched, the mask 20 is modified when the substrate 20 is adhered to the mask 20, causing a film-penetration.

The mask 20 that is used in the above-described PECVD process has limitations in that a shadow effect may seriously occur at the boundary between the frame 21 and the mask pattern 22. Also, a film-penetration may occur at the masking region when the mask 20 is lifted as the stage is raised.

SUMMARY OF THE INVENTION

Accordingly, the present invention is directed to a mask for forming a pattern on a substrate in a deposition apparatus and a method for manufacturing a display device using the same that substantially obviates one or more of the problems due to limitations and disadvantages of the related art.

An advantage of the present invention is to provide an improved display device that includes a pattern of a thin film formed by a mask having a frame that has an inclined surface.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a mask for forming a thin film pattern on a substrate may include a mask pattern that defines where the thin film pattern to be formed on the substrate; and a frame that supports the mask pattern and includes an inclined plane which tapers in an inner direction where the mask pattern is disposed.

In another aspect of the present invention, a method for manufacturing a display device may include providing a substrate on a stage in a deposition chamber; aligning a mask with either the substrate or the stage using an alignment mark, wherein the mask includes a frame and a mask pattern adhered to the frame, and wherein the frame has an inclined surface that tapers toward an inner direction where the mask pattern is disposed; and depositing a thin film through the mask in the deposition chamber to form a pattern of the thin film on the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to exemplary embodiments of the present invention, examples of which are illustrated in the accompanying drawings. The same reference numbers may be used throughout the drawings to refer to the same or like parts.

Hereinafter, an embodiment of the present invention will be described with reference to the accompanying drawings.

Figure 1:
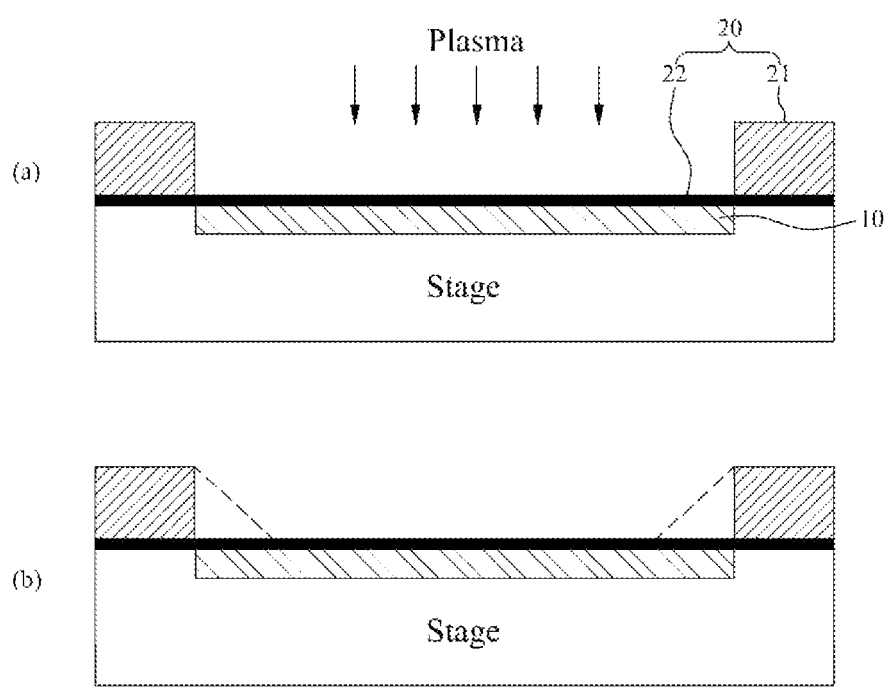
FIGS. 1 and 2 are exemplary views illustrating a state where a substrate and a mask are aligned in a PECVD apparatus according to the related art.
Figure 2:
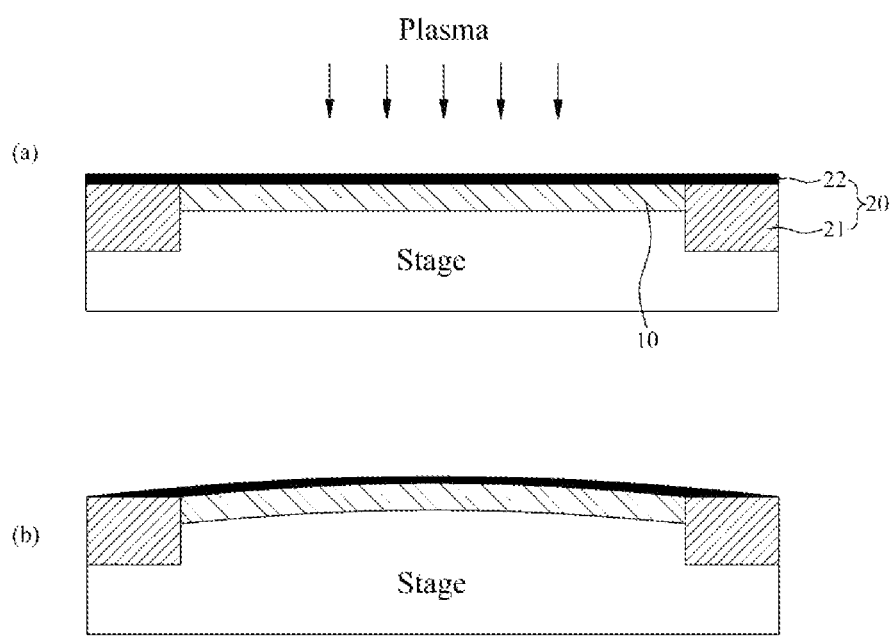
Figure 3:
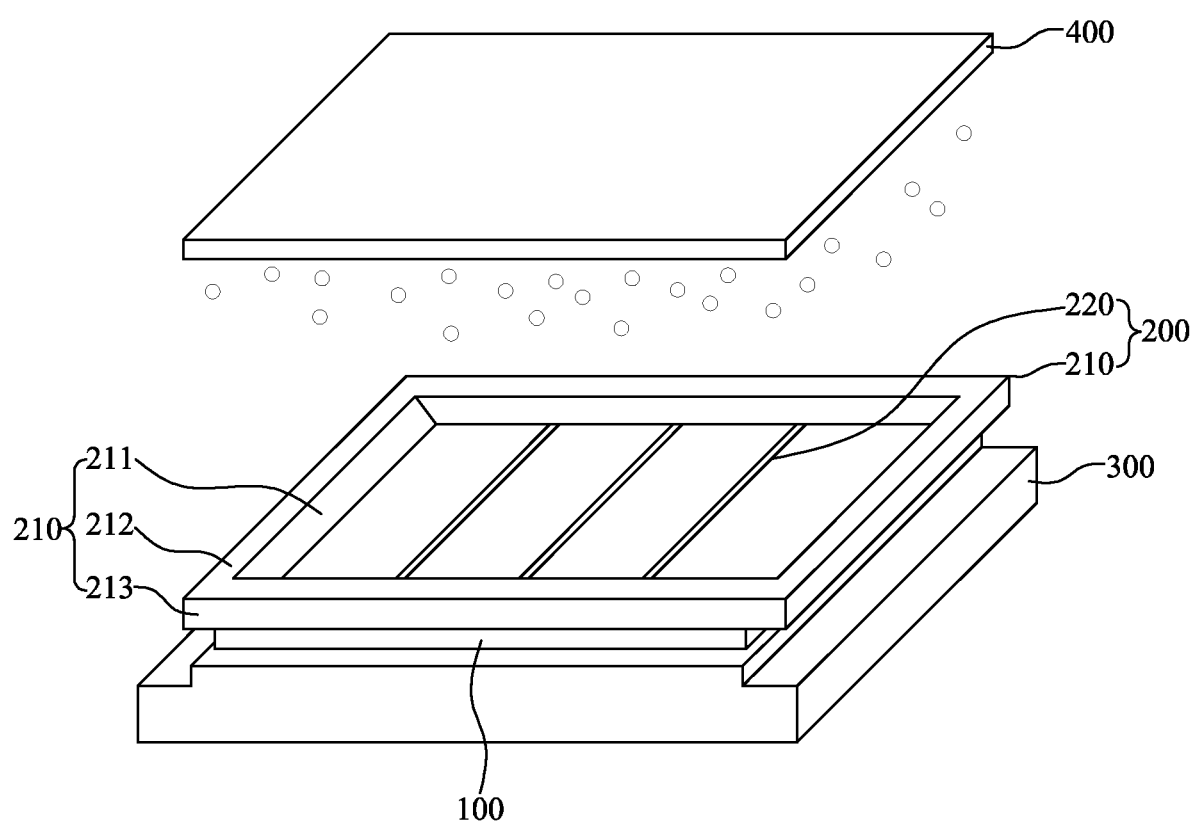
FIG. 3 is an exemplary view illustrating a state where a substrate and a mask are aligned in a PECVD apparatus according to the present invention.

FIG. 3 is an exemplary view illustrating a state where a substrate and a mask are aligned in a PECVD apparatus according to the present invention.

As described above, the PECVD provides one or more compound gases, which includes an element configuring a thin film material to be formed, onto a substrate and thus forms a desired thin film by a chemical reaction that is performed in a gaseous state or a substrate surface. Such a PECVD is generally used when forming a thin film on a substrate without mask, but a mask 200 of FIG. 3 according the present invention may be used, for example, when a passivation layer of an OLED display is formed. That is, a mask according to the present invention can be used when forming a passivation layer of an OLED display or other thin films.

Hereinafter, a mask applied to a PECVD apparatus and used to form a passivation layer of an OLED display will be described as an embodiment of the present invention. However, the present invention is not limited to such an application. For example, the present invention may be applied to a mask for patterning various kinds of thin films on a substrate in a PVD process, an APCVD process, an LPCVD process, or other deposition processes and techniques. The present invention relates to a mask for forming a pattern on a substrate in a deposition apparatus, and thus detailed description on an PECVD apparatus may not be provided.

As illustrated in FIG. 3, the PECVD apparatus includes a stage 300 on which a substrate 100 is disposed, the mask 200 that is disposed over the substrate 100 for forming various kinds of thin film patterns on the substrate 100, and a shower head 400 for conformally providing a source gas onto the substrate 100.

The mask 200 according to the present invention includes a mask pattern 220 for forming a thin film pattern that will be formed on the substrate 100, and a frame 210 for supporting the mask pattern 220. An inner surface 211 of the frame 210 has an inclined plane that tapers in a direction from an upper end of the frame 210 to a lower end of the frame 210.

Various types of thin film patterns for an OLED display can be formed using the mask pattern 220. Herein, the mask pattern 220 may use a metal (such as Invar, Kovar, or Elinvar) having a low thermal expansivity (for example, about 5.0 ppm/degree), ceramic, or the like. That is, because heat is produced during the deposition process, the mask pattern 220 is beneficially formed of a metal material that has a low thermal expansion.

The frame 210 may be formed of ceramic or metal. When the frame 21 is formed of metal, sagging of the mask may be minimized through stretch.

The frame 210 is also beneficially formed of a material having a small thermal expansion coefficient so that the shape modification of the frame 210 due to heat can be minimized. Herein, the thermal expansion coefficient may be equal to or less than about $10^{-7}$ mm/° C. to about $2.0 \times 10^{-6}$ mm/° C.

The frame 210 may include the inner surface 211 that surrounds an inner side which is section-formed by the frame 210, an outer surface 213 that surrounds an outer of the frame 210, an upper surface 212 that surrounds a gap between an upper end of the outer surface 213 and an upper end of the inner surface 211, and a lower surface (not shown) that surrounds a gap between a lower end of the outer surface 213 and a lower end of the inner surface 211.

That is, the frame 210 has a tetragonal shape similar to the shape of the substrate 100. A surface formed inside the frame 210 is referred to as the inner surface 211, and a surface formed on the frame 210 is referred to as the upper surface 212. A surface formed at an outer side of the frame 210 is referred to as the outer surface 213, and a surface formed under the frame 210 is referred to as a lower surface (not shown).

Herein, the mask pattern 220 may be adhered to the lower surface (not shown) of the frame 210. That is, the mask pattern 220 is stretched and adhered to the frame 210 in a direction opposite the plasma forming portion in the PECVD apparatus.

One of the advantages of the present invention is to minimize or prevent the shadow of the frame 210 from negatively affecting the substrate 100 that is disposed inside the frame 210 during the formation of, for example, a thin film of an OLED display with a PECVD apparatus. For this, as illustrated in FIG. 3, the inner surface 211 of the present invention has an inclined plane that tapers in a direction from the upper surface 212 of the frame 210 to the lower surface (not shown) of the frame 210.

Therefore, when a source gas is injected into the substrate 100 through the mask 200, the shadow of the frame 210 may not be formed at the substrate 100 due to the tapered inner surface 211.

The tapered angle of the inner surface 211 may be set between 15 and 45 degrees with respect to a lower surface contacting the substrate 100.

Figure 4:
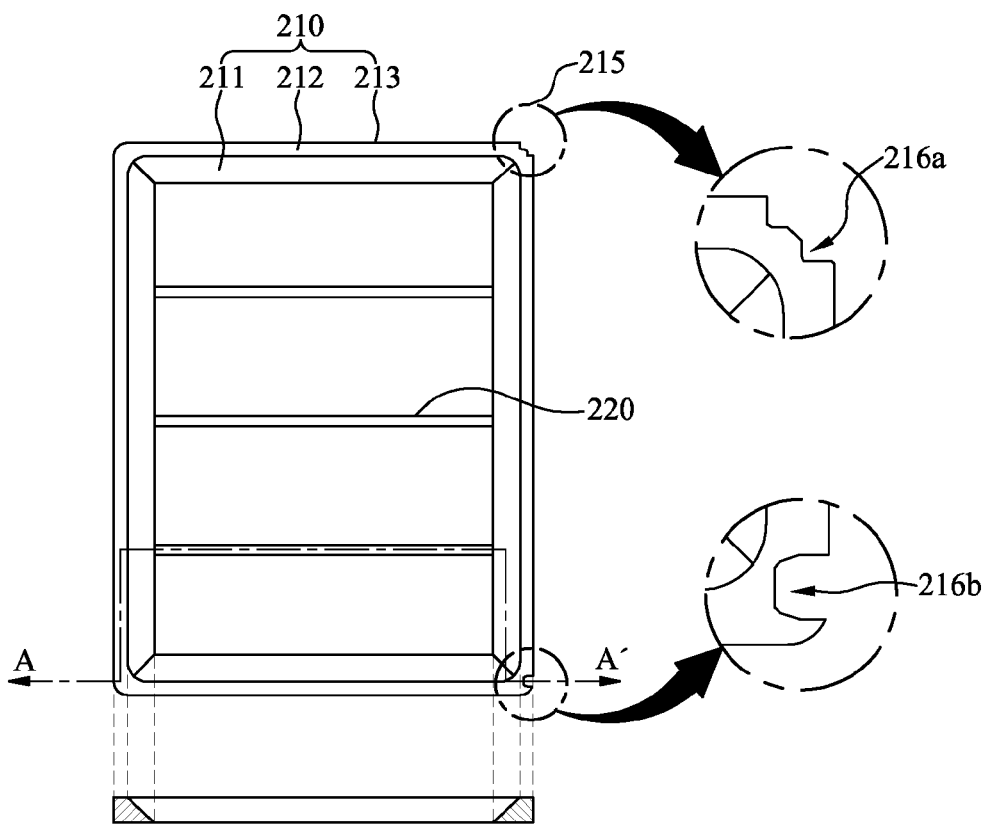
FIG. 4 is an exemplary view illustrating a mask according to a first embodiment of the present invention.
Figure 5:
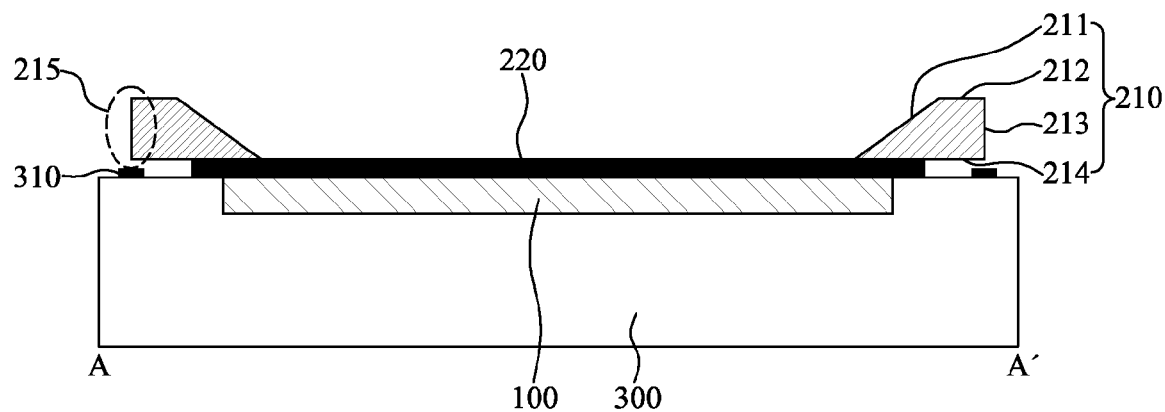
FIG. 5 is a cross-sectional view along line A-A' in FIG. 4 illustrating a state where the mask of FIG. 4 is disposed on a stage of a PECVD apparatus.

FIG. 4 is an exemplary view illustrating a mask according to a first embodiment of the present invention. FIG. 5 is a cross-sectional view along line A-A' illustrating a state where the mask of FIG. 4 is disposed at a stage of a PECVD apparatus.

In the mask 200 according to the first embodiment of the present invention, as illustrated in FIG. 4, the frame 210 that is formed in a tetragonal shape similarly to the outer shape of the substrate 100 includes an inner surface 211, an upper surface 212, an outer surface 213 and a lower surface 214. In particular, the inner surface 211 tapers in a direction from the upper surface 212 to the lower surface 214, i.e., the inner direction of the frame 210 and thus forms an inclined plane.

In the mask 200 according to the present invention, as illustrated in FIG. 4, an alignment part 215 may be formed in at least two of the outer portions of the mask 200.

That is, the alignment part 215 includes alignment marks 216a and 216b that are used for aligning the mask 200 with the stage 300. The alignment marks 216a and 216b can be formed in various shapes.

The alignment mark 216 may be formed in various shapes using the upper surface 212, the outer surface 213, the lower surface 214, or the combinations thereof.

In FIG. 4, the alignment marks having different shapes are formed in the frame 210 of the mask 200. However, the present invention is not limited thereto, and alignment marks having the same shape may be formed.

As illustrated in FIG. 5, the present invention forms the alignment masks 216a and 216b on the mask 200 and a stage alignment mark 310 corresponding to the alignment marks 216a and 216b on the stage 300, thereby allowing the mask 200 to be aligned with the stage 300. That is, a separate apparatus for aligning the mask with the stage of the PECVD apparatus is not required.

In the related art, it is difficult to perform alignment when a frame is modified by thermal expansion. However, the mask according to the present invention includes the alignment part 215 in the outer of the frame 210 so that it is easy to align the mask 200 with the stage 300.

To use the alignment mark 216, the size of the frame 210 may be greater than that of the substrate 100, and thus the alignment mark 216 of the frame 210 and the stage alignment mark 310 formed on the stage 300 can be easily aligned.

The alignment marks 216a and 216b of the mask 200 and the stage alignment mark 310 may be aligned with a camera. Also, because the alignment marks 216a and 216b of the mask 200 and the stage alignment mark 310 may be seen from the outside with the human eye, a user may directly align the alignment marks without using a separate camera.

Because the alignment part 215 is formed in the mask 200, the present invention enables mechanical alignment even without using a separate vision camera (for example, a camera, etc.).

Figure 6:
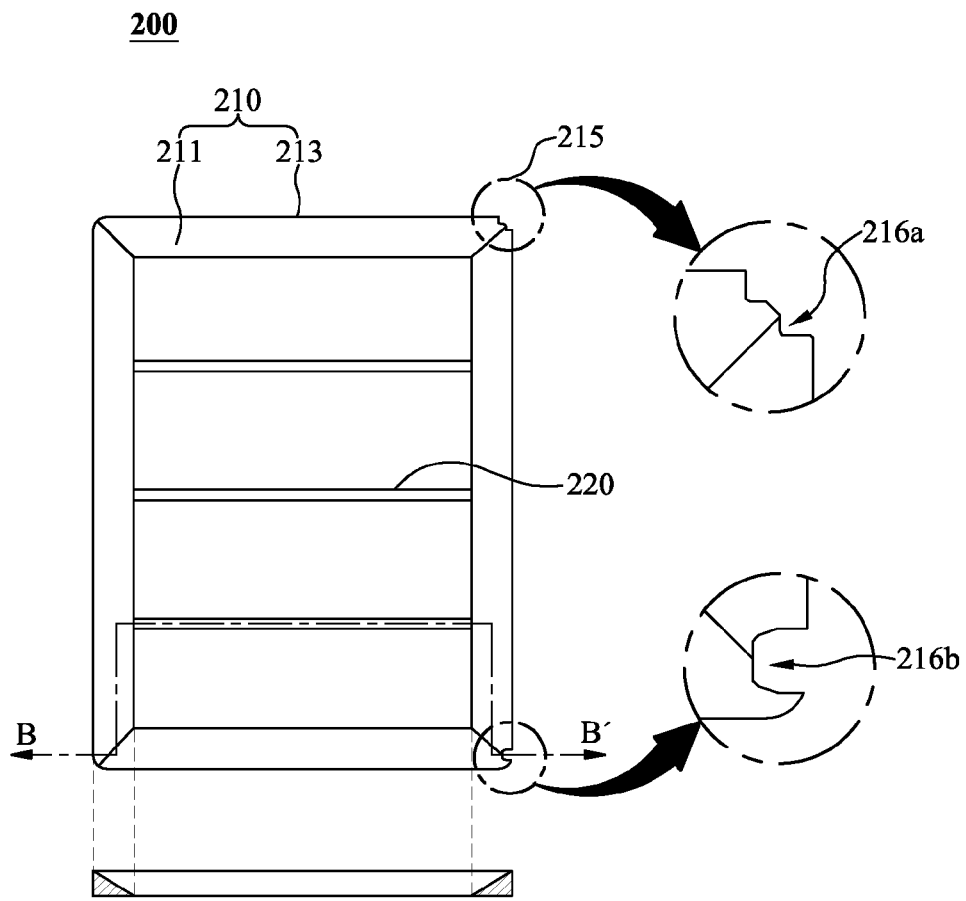
FIG. 6 is an exemplary view illustrating a mask according to a second embodiment of the present invention.
Figure 7:
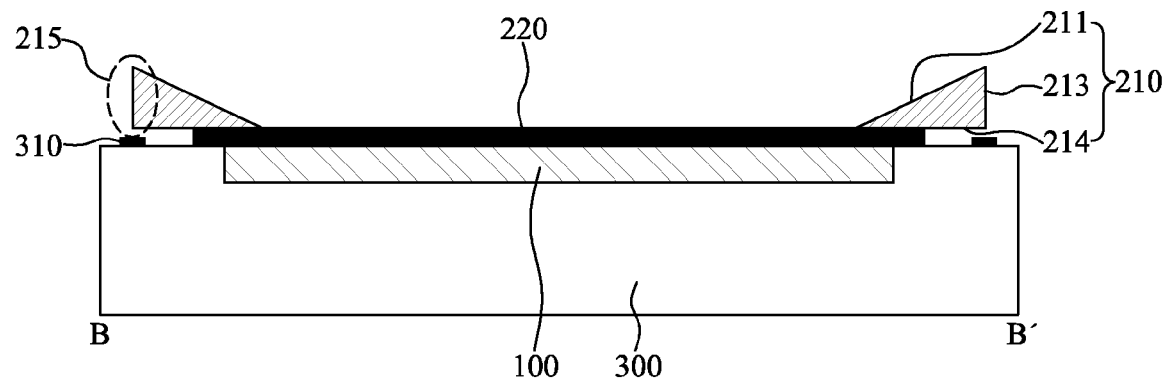
FIG. 7 is a cross-sectional view along line B-B' illustrating a state where the mask of FIG. 6 is disposed on a stage of a PECVD apparatus.

FIG. 6 is an exemplary view illustrating a mask according to a second embodiment of the present invention. FIG. 7 is a cross-sectional view along line B-B' illustrating a state where the mask of FIG. 7 is disposed on a stage of a PECVD apparatus.

A mask according to the second embodiment of the present invention performs the same function as that of the mask according to the first embodiment of the present invention that is illustrated in FIGS. 4 and 5, and has a modified external shape of the frame 210.

In the mask 200 according to the second embodiment of the present invention, as illustrated in FIGS. 6 and 7, a frame 210 that is formed in a tetragonal shape similarly to the outer shape of a substrate includes an inner surface 211, an outer surface 213, and a lower surface 214. Particularly, the inner surface 211 tapers in a direction from an upper end of the outer surface 213 to the inside of frame 210 and thus forms an inclined plane.

In the frame 210 of the mask 200 according to the second embodiment of the present invention, an upper surface is not separately formed between the inner surface 211 and the outer surface 213, and the inner surface 211 has thus an inclined plane that tapers in a direction from an edge between the inner surface 211 and the outer surface 213 to a lower end of the inner surface 211.

Due to the above-described structure, the outer thickness of the frame 210 decreases, and thus the frame 210 may be lightened.

Even in the first embodiment of the present invention, because the inner surface 211 is inclined in a tapered shape, the thickness and weight of the frame 210 can be reduced compared to the related art frame.

An alignment part 215 may be formed in the mask 200 according to the second embodiment of the present invention, and its structure and function are the same as those of the alignment part according to the first embodiment of the present invention.

As described above, the design and manufacturing the frame 210 is such that the mask according to the present invention can minimize a mask shadow when, for example, forming a passivation layer of an OLED display in a PECVD process. That is, the present invention can form, for example, a pattern of a passivation layer with an enhanced lifetime and reliability in an OLED display.

In an OLED display device, a shadow effect occurs due to the shape of the frame of the mask when, for example, forming a passivation layer of an inorganic thin film. The shadow effect decreases the thickness of the passivation layer at a masking region and thus shortens the lifetime of the OLED display. Furthermore, the shadow effect increases the bezel region and thus the size of the panel. If the panel size increases, there is a limitation in the number of panels that are produced in one glass substrate, causing increase in the facility size and the facility costs. To solve such limitations, a mask of the present invention has a tapered frame that can minimize the shadow length.

According to the present invention, the frame has a shape where the inner surface of the frame tapers in a direction from the upper end of the frame to the lower end of the frame, and thus the shadow region formed on the substrate can be reduced. Accordingly, reliability of the OLED display can be enhanced, and the lifetime of the OLED can be extended.

The present invention decreases the shadow region formed on the substrate, thereby enabling a narrow bezel technology with a reduced bezel region.

Efficiency of the substrate increases due to the reduction in the size of the bezel, and thus the product costs can decrease. Therefore, the size of the facility can also be reduced, and the facility costs can thus be saved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A mask for forming a thin film pattern on a substrate, the mask comprising:
    a mask pattern that defines the thin film pattern to be formed on the substrate; and
    a frame that supports the mask pattern and includes an inclined plane which tapers in an inner direction where the mask pattern is disposed, wherein at least two alignment marks are formed in corner areas of the frame, and the frame is aligned with a stage by aligning the alignment marks and stage alignment marks formed on the stage.

2. The mask according to claim 1, wherein the mask pattern is formed of either a metal or ceramic material, and wherein the mask pattern has a thermal expansivity equal to or less than about 5.0 ppm/K.

3. The mask according to claim 1, wherein the mask pattern is adhered to the frame in a direction opposite a plasma forming potion of a deposition chamber.

4. The mask according to claim 1, wherein the inclined plane has an angle between about 15 degrees and 45 degrees with respect to either the substrate or the stage.

5. The mask according to claim 1, wherein a cross-section of the frame has either a tetragonal or triangular shape.

6. The mask according to claim 1, wherein the frame is formed of either a metal or ceramic material.

7. The mask according to claim 6, wherein the frame has a thermal expansion coefficient equal to or less than about $10^{-7}$ mm/° C. to about $2.0 \times 10^{-6}$ mm/° C.

8. The mask according to claim 1, wherein the frame comprises:
    an inner surface for surrounding an inner side which is section-formed by the frame;
    an outer surface for surrounding an outer of the frame; and
    a lower surface for surrounding a gap between a lower end of the outer surface and a lower end of the inner surface.

9. The mask according to claim 8, wherein the inner surface has a tapered shape which tapers in the inner direction from an upper end of the outer surface.

10. A method for manufacturing a display device, the method comprising:
    providing a substrate on a stage in a deposition chamber;
    aligning a mask with either the substrate or the stage using an alignment mark, wherein the mask includes a frame and a mask pattern adhered to the frame, and wherein the frame has an inclined surface that tapers toward an inner direction where the mask pattern is disposed; and
    depositing a thin film through the mask in the deposition chamber to form a pattern of the thin film on the substrate,
    wherein at least two alignment marks are formed in corner areas of the frame, and the frame is aligned with the stage by aligning the alignment marks and stage alignment marks formed on the stage.

11. The method according to claim 10, wherein the mask pattern is formed of either a metal or ceramic material, and wherein the mask pattern has a thermal expansivity equal to or less than about 5.0 ppm/K.

12. The method according to claim 10, wherein the deposition chamber is a PECVD chamber and the mask pattern is adhered to the frame in a direction opposite a plasma forming potion of the PECVD chamber, and wherein the pattern of the thin film is a pattern of a passivation layer of the display device.

13. The method according to claim 10, wherein the inclined surface has an angle between about 15 degrees and 45 degrees with respect to either the substrate or the stage.

14. The method according to claim 10, wherein a cross-section of the frame has either a tetragonal or triangular shape.

15. The method according to claim 10, wherein the frame is formed of either a metal or ceramic material.

16. The method according to claim 15, wherein the frame has a thermal expansion coefficient equal to or less than about $10^{-7}$ mm/° C. to about $2.0 \times 10^{-6}$ mm/° C.

17. The method according to claim 10, wherein the frame comprises:
    an inner surface for surrounding an inner side which is section-formed by the frame;
    an outer surface for surrounding an outer of the frame; and
    a lower surface for surrounding a gap between a lower end of the outer surface and a lower end of the inner surface.

18. The method according to claim 17, wherein the inner surface has a tapered shape which tapers in the inner direction from an upper end of the outer surface.

* * * * *